United States Patent
Cheng et al.

(10) Patent No.: US 6,958,872 B1
(45) Date of Patent: Oct. 25, 2005

(54) METHOD AND APPARATUS FOR MEASURING AN OUTPUT SIGNAL OF A FLOATING TRANSDUCER

(75) Inventors: Yi Cheng, San Jose, CA (US); Steven Lam, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 25 days.

(21) Appl. No.: 10/683,478

(22) Filed: Oct. 10, 2003

Related U.S. Application Data

(63) Continuation of application No. 09/615,062, filed on Jul. 12, 2000, now Pat. No. 6,633,441.

(51) Int. Cl.[7] ............ G11B 27/36; G11B 5/02; G11B 5/09
(52) U.S. Cl. ............ 360/31; 360/46; 360/67
(58) Field of Search ............ 360/31, 67, 46; 327/307, 560, 110, 561, 562; 330/250, 253, 288

(56) References Cited

U.S. PATENT DOCUMENTS

| | | | |
|---|---|---|---|
| 4,554,515 A | 11/1985 | Burson et al. | 330/261 |
| 4,656,437 A | 4/1987 | Saari | 330/253 |
| 5,270,882 A | 12/1993 | Jove et al. | 360/67 |
| 5,515,010 A | 5/1996 | Peterson | 330/288 |
| 5,539,342 A | 7/1996 | Gersbach et al. | 327/110 |
| 5,574,401 A | 11/1996 | Spitalny | 330/253 |
| 5,633,765 A | 5/1997 | Lin et al. | 360/46 |
| 5,661,612 A | 8/1997 | Hasegawa et al. | 360/59 |
| 5,672,993 A | 9/1997 | Runaldue | 327/404 |
| 5,859,564 A | 1/1999 | Sonntag et al. | 327/156.3 |
| 5,959,798 A | 9/1999 | Sasaki et al. | 360/67 |
| 6,005,431 A | 12/1999 | Mehr et al. | 327/307 |
| 2003/0053239 A1 * | 3/2003 | Jiang | 360/66 |

* cited by examiner

Primary Examiner—Andrew L. Sniezek

(57) ABSTRACT

A circuit for measuring signal output of a transducer includes an amplifier having a differential input and a single ended output referenced to a fixed potential. One transducer terminal is coupled through a source follower to an input terminal of the differential input and the other transducer terminal is coupled through a source follower and a resistive element to the other input terminal of the differential input whereby the transducer terminals are isolated from the fixed potential. A voltage to current converter converts the voltage at the single ended output to an output current that is applied to an input branch of a current mirror. A first output branch of the current mirror supplies a current equal to the converter output current to one terminal of the differential input. A second output branch of the current mirror supplies a current equal to the converter output current to the other terminal of the differential input. A third output branch of the current mirror supplies a multiple of the converter output current to a resistive element having a terminal connected to the fixed potential.

12 Claims, 5 Drawing Sheets

METHOD AND APPARATUS FOR MEASURING AN OUTPUT SIGNAL OF A FLOATING TRANSDUCER

CROSS-REFERENCE TO RELATED APPLICATIONS

This application is a continuation of U.S. patent application Ser. No. 09/615,062 filed on Jul. 12, 2000 now U.S. Pat. No. 6,633,441. The disclosure of the above application is incorporated herein by reference in its entirety.

BACKGROUND OF THE INVENTION

1. Field of the Invention

This invention generally relates to a transducer measuring arrangement and more particularly to CMOS circuit arrangements for measuring voltage from a magnetic transducer element.

2. Description of the Related Art

In currently used electronic apparatus, it is often necessary to measure the output signal from a transducer to assure proper operation. Generally, transducers used in personal computers or similarly designed equipment only provide a very low output signal which makes accurate measurement of transducer output difficult and expensive. Accordingly, some type of amplification is needed to substantial improvement in measurement accuracy. FIG. 1 shows a functional block diagram of a known arrangement for amplifying the output of a device such as a magneto-resistive head of a hard disk unit in processing equipment to provide accurate head output voltage measurement. In FIG. 1, a current source 101 provides a current bias to a magneto-resistive head 103 and a voltage source 105 connects the head 103 to an appropriate reference voltage such as ground. The inputs of a voltage buffer 107 for amplification are coupled to the head 103 and the amplified head signal appears at an output 110. Using amplification, the measurements may be performed without excessive loading of the head 103 at a voltage level suitable for accurate measurement.

FIG. 2 shows a block diagram of a circuit useful as the voltage buffer 107 in FIG. 1. Referring to FIG. 2, one lead from the magneto-resistive head 103 is connected to an input 210 of an operational amplifier 207 and the other lead of the magneto-resistive head 103 is connected to a ground reference. A resistor 201 having a value R has one lead therefrom connected to the other input 213 of the operational amplifier 207 and another lead connected to the ground reference. A feedback resistor 205 having a value 4R is connected between an output 220 of the amplifier 207 and the amplifier input 213. As is well known, the voltage at input 210 substantially appears entirely across the resistor 201 and the current I through resistor 201 is $$I = V_{201}/R$$

The same current I flows through feedback resistor 205 and the voltage at the output 220 is $$V_{220} = I(R+4R) = I*5R$$

so that the voltage at the output 220 is $5V_{201}$. Accordingly, the operational amplifier 207 provides a voltage gain of 5 and the output voltage of the magneto-resistive head 103 which may be on the order of 200 mv is increased to a voltage in the one volt range to improve the accuracy of the measurement of the head voltage.

FIG. 3 is a detailed diagram of an exemplary prior art CMOS amplifier circuit that may be used as the operational amplifier 207 of FIG. 2. Referring to FIG. 3, there is shown a differential amplifier having inputs 380 and 382 which inputs are applied to the gates of N type CMOS transistors MN301 and MN302. The sources of the NMOS transistors MN301 and MN302 are connected to a current source formed by the serial drain-source paths of NMOS transistors MN305 and MN307. The gate of the NMOS transistor MN305 is provided with a bias voltage from a voltage supply line 366. The gate of the NMOS transistor MN307 is provided with bias voltage from a voltage supply line 368 and has its source connected to a ground reference line 369.

The arrangement of PMOS transistors MP309 and MP311 and NMOS transistors MN 320 and MN322 connected between positive supply line 360 and ground reference line 369 is coupled to the drain of NMOS transistor MN301 between the drain of PMOS transistor 309 and the source of PMOS transistor MP311. NMOS transistors MN320 and MN322 form a cascoded current bias arrangement for the cascoded PMOS transistors MP309 and MP311. Similarly, the arrangement of PMOS transistors MP313 and MP315 and NMOS transistors MN 324 and MN326 connected between positive supply line 360 and ground reference line 369 is coupled to the drain of NMOS transistor MN302 between the drain of PMOS transistor 313 and the source of PMOS transistor MP315. NMOS transistors MN324 and MN326 form a cascoded current bias arrangement for the cascoded PMOS transistors MP313 and MP315. A bias supply line 362 supplies a bias to the gates of the PMOS transistors MP309 and MP313 and a bias supply line 369 supplies a bias to the cascoded PMOS transistors MP311 and MP315. The gates of NMOS type cascoded transistors MN320 and MN324 receive a bias voltage from the supply line 366 and the gates of NMOS bias current transistors MN322 and MN326 receive a bias voltage from the supply line 368.

Cascoded P type transistors MP309 and MP311 couple the output obtained from the NMOS transistor MN301 to the gate of a PMOS transistor MP342 which has its source connected to positive supply line 360 and its drain connected to cascoded NMOS transistors MN328 and MN330. NMOS transistors MN328 and MN330 connected between the drain of the PMOS transistor MP342 and the ground reference line 369 form a current source for the PMOS transistor MP342. A single ended output is provided by PMOS transistor MP342 at terminal 350. Similarly, cascoded PMOS transistors MP313 and MP315 couple the output obtained from the NMOS transistor MN302 to the base of a PMOS transistor MP340 which has its source connected to positive supply line 360 and its drain connected to cascaded NMOS transistors MN332 and MN334. NMOS transistors MN332 and MN334 connected between the drain of the PMOS transistor MP340 and the ground reference line 369 form a current source for the PMOS transistor MP340. A single ended output is provided by PMOS transistor MP340 at terminal 352.

The use of a CMOS operational amplifier circuit such as shown in FIG. 3 provides the advantages of compatibility with integrated circuit arrangements used in present electronic apparatus and minimum power consumption. There remains a problem, however, in that the input to the operational amplifier from the transducer must be referenced to the same fixed reference potential point as the output of the amplifier. In FIG. 2, the transducer 103 connected to the voltage buffer 207 and the output of the voltage buffer must both be referenced to the same ground potential point. Accordingly, restrictions are imposed on the ground connections of components on the input side of the voltage buffer which severely limit the operational arrangements of the transducer. With respect to a magneto-resistive head, the normal operation of the head in a fixed disk unit requires that the head be isolated from a fixed ground potential.

SUMMARY OF THE INVENTION

The invention is directed to a transducer measuring circuit in which an output provided by the transducer is amplified for measurement. In accordance with the invention, the transducer output is a voltage that is coupled to a differential input of a converter in which the coupled voltage is converted to a current. The output current of the converter is applied to a voltage former referenced to a fixed potential and the output voltage of the voltage former is measured.

According to one aspect of the invention the converter is an operational amplifier with a differential input and a single ended output returned to the fixed potential which provides amplification for measurement. The transducer output is coupled to a differential input of the operational amplifier through a coupling arrangement isolated from the fixed potential to which the single ended amplifier output is returned. The operational amplifier output is converted to a current signal that is fed back to the differential input.

According to another aspect of the invention, the converted current signal from the operational amplifier output is fed back to the differential input through a current mirror.

According to yet another aspect of the invention, the differential input of the operational amplifier has first and second terminals and a single ended output. The signal from the transducer in coupled in series with a resistive element to the first and second terminals and the converted current from the amplifier output is fed back through the current mirror to the first and second terminals of the differential input.

According to yet another aspect of the invention, one transducer terminal is coupled to the gate of a first CMOS transistor having its source connected to the first terminal of the differential input. The other transducer terminal is coupled to the gate of a second CMOS transistor having a source connected to one terminal of the resistive element. The other terminal of the resistive element is connected to the second terminal of the differential input. The drains of the first and second CMOS transistors are connected to the fixed potential. In this way, the transducer signal coupling is isolated from the fixed potential.

According to yet another aspect of the invention, the current mirror has an input branch that receives the converted output current of the amplifier through a voltage-to-current converter. A first output branch of the current mirror is coupled to the first terminal of the differential input and a second output branch of the current mirror is coupled to the second terminal of the differential input.

According to yet another aspect of the invention, the current mirror has a third output current branch that supplies an output current to one terminal of a resistive element having its other terminal connected to the reference potential.

According to yet another aspect of the invention, the first output branch of the current mirror supplies a current substantially equal to the output current from the voltage to current converter to the first terminal of the differential input, the second output branch of the current mirror supplies a current substantially equal to the output current from the voltage to current converter to the second terminal of the differential input, and the third output current branch of the current mirror supplies a multiple of the output current from the voltage to current converter to the resistive element connected thereto.

According to yet another aspect of the invention, the transducer is a magneto-resistive head.

A fuller understanding of the invention will become apparent and appreciated by referring to the following description and claims taken in conjunction with the accompanying drawings.

DESCRIPTION OF THE PREFERRED EMBODIMENTS

Figure 7:
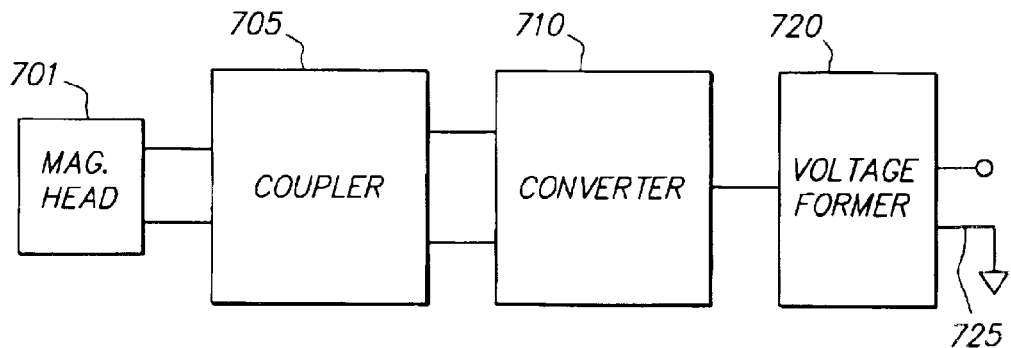
FIG. 7 depicts a general block diagram of a magnetic head output measuring circuit illustrative of the invention.

FIG. 7 is a general block diagram illustrating the invention. Referring to FIG. 7, there is shown a magnetic head 701 which may be of a magneto-resistive type used in a hard disk system, a coupler 705, a converter 710, a voltage former 720 and a fixed potential return 725 on the voltage former output. During measurement, an output voltage from the magnetic head 701 is coupled to a differential input of the converter 710 through the coupler 705. The converter 705 converts the coupled output voltage of the magnetic head 701 to a current and the voltage former 720 provides a voltage output referenced to the fixed potential line 725. In this way, the low output voltage of the magnetic head 701 is amplified to a level that allows easy measurement. The magnetic head 701 and the coupler 705 may be substantially isolated from the fixed potential line 725 to permit floating operation of the magnetic head and to reduce noise in the voltage at the output of the voltage former which is to be measured.

Figure 1:
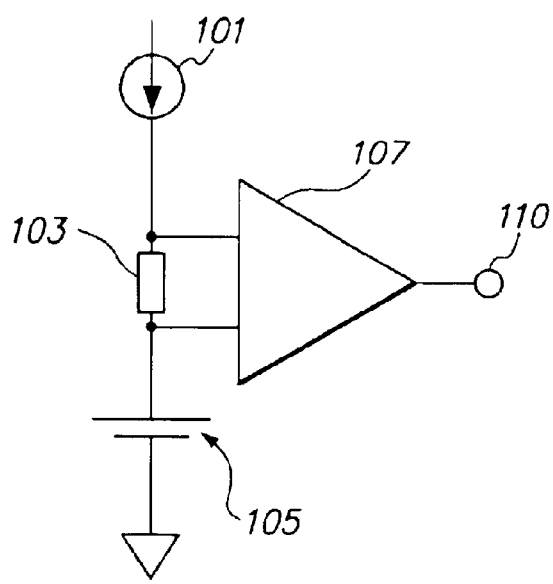
FIG. 1 shows a functional block diagram of a transducer measuring circuit according to the prior art.
Figure 2:
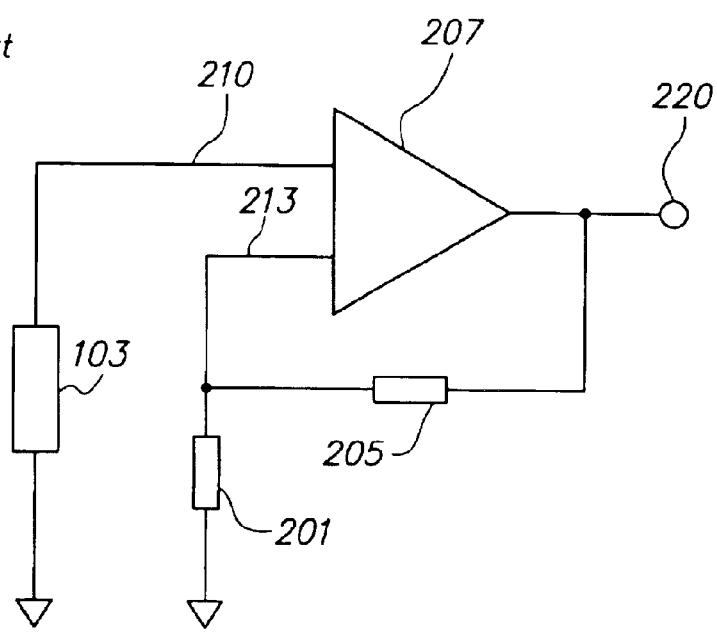
FIG. 2 shows a block diagram of a transducer measuring circuit using an operational amplifier.
Figure 3:
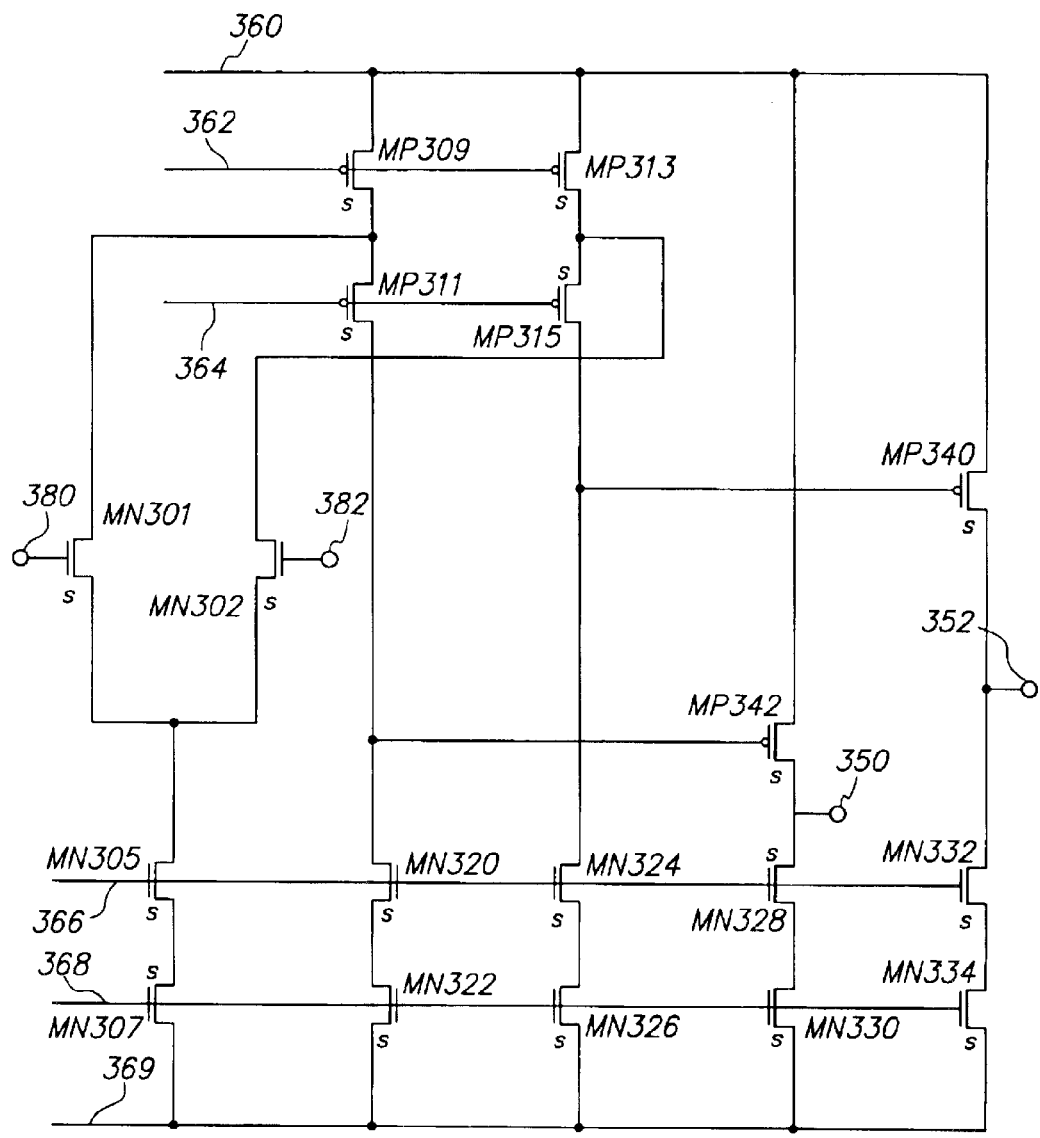
FIG. 3 depicts a prior art CMOS operational amplifier useful in the transducer measuring circuit of FIG. 2.
Figure 4:
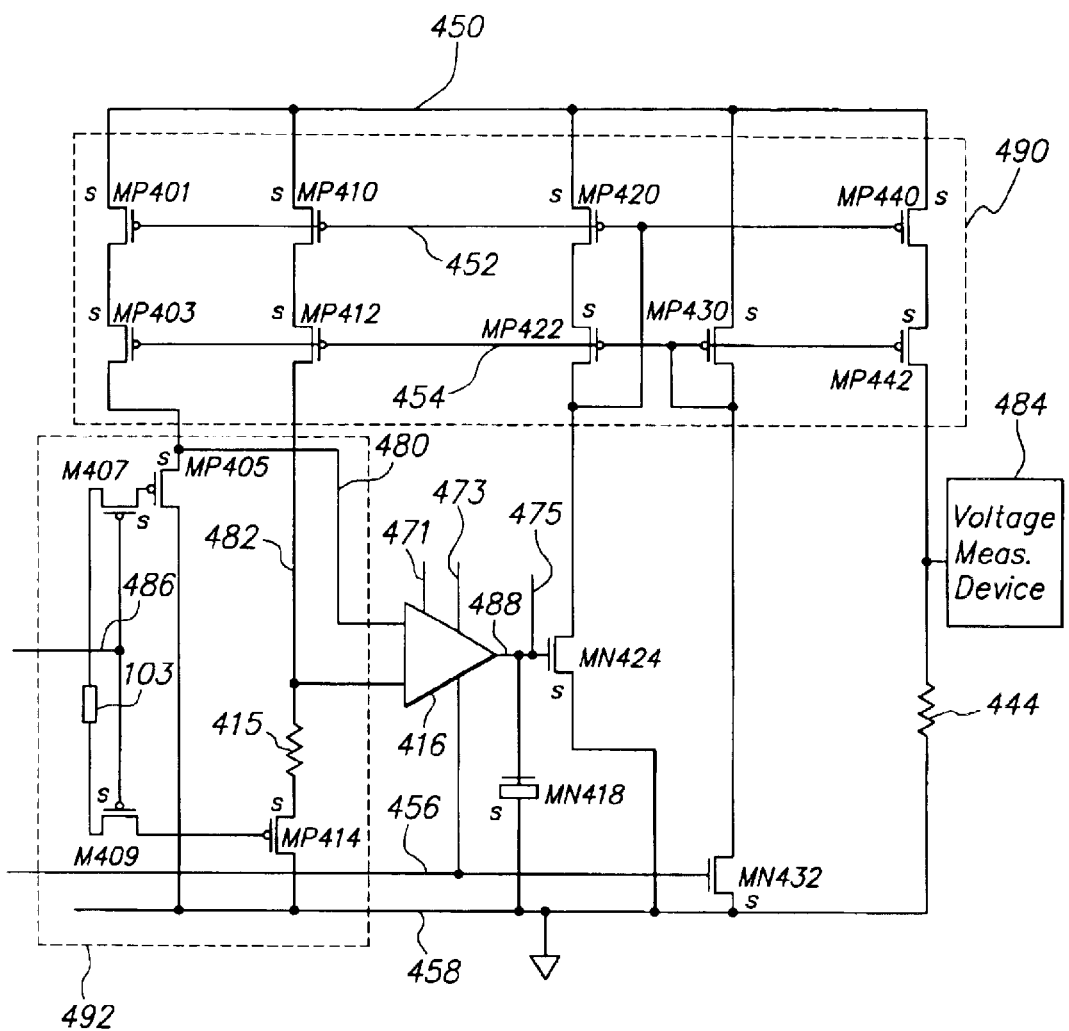
FIG. 4 depicts a CMOS transducer measuring circuit illustrative of the invention.

FIG. 4 shows CMOS circuit adapted to measure the voltage of a transducer such as a magneto-resistive head 103 that is illustrative of the invention. The circuit of FIG. 4 includes the transducer 103, an operational amplifier 416, an input coupling arrangement 492 between the transducer 103 and the operational amplifier 416, a PMOS stabilizing transistor MP418 and an NMOS voltage to current converter transistor MN424 at the operational amplifier output and a current mirror 490 coupled between the voltage to current converter MN424, the input coupling arrangement 492, an output resistive element 444 and a voltage measuring device 484. The input coupling arrangement 492 includes PMOS transistors MP407 and MP409, source follower PMOS transistors MP405 and MP414 and a resistor 415. The current mirror 490 couples the current from NMOS voltage to current converter transistor MN424 to inputs 480 and 482 of the operational amplifier 416 and to a voltage measuring device 484. The current mirror 490 includes a bias current branch of PMOS transistor MP430 biased by NMOS bias current transistor MN432 and an input branch including cascoded PMOS transistors MP420 and MP422 coupled to the voltage to current converter transistor NM424. A first output branch of the current mirror including serially connected PMOS transistors MP401 and MP403 is coupled to the input 480 of the amplifier 416. A second output branch of the current mirror including serially connected PMOS transistors MP410 and MP412 is coupled to the other input 482 of amplifier 416. A third output branch of the current mirror including serially connected transistors MP440 and MP442 is coupled to the output resistor 444 and the voltage measuring device 484.

During normal operation, the magneto-resistive head 103 of a hard disk system has both of its terminals isolated from a fixed reference potential such as ground and is isolated from the operational amplifier 416 by turned-off NMOS switching transistors MN407 and M409. When a measurement of the head voltage is performed, a control signal on line 484 from a control (discussed later) turns NMOS transistor switches MN407 and MN409 on. The NMOS transistor switch MN407 connects one terminal of the head 103 to a gate of the PMOS source follower transistor MP405. The source of PMOS source follower transistor MP405 which is connected to the input 480 of the operational amplifier 416 receives a bias current from the drain of the PMOS transistor MP403. Similarly, NMOS transistor switch MN409 connects the other terminal of the head 103 to the gate of PMOS source follower transistor MP414. The source of PMOS source follower transistor MP414 receives current from the drain of PMOS transistor MP412 through the resistor 415. The drain of PMOS transistor MP412 is connected to the input 482 of the operational amplifier 416. The drains of PMOS source follower transistors MP405 and MP414 are connected to ground reference line 458.

A signal voltage (e.g., 200 millivolts) produced across the magneto-resistive head 103 is coupled between the sources of the source follower transistors MP405 and MP414. Substantially all the signal voltage from the magneto-resistive head 103 appears across the resistor 415 since the operational amplifier has a voltage gain in the order of several thousand and the voltage across the terminals 480 and 482 is negligible. NMOS transistor MN418 having its gate connected to the operational amplifier output on line 488 and its source and drain connected to the ground reference line 458 provides a capacitance to stabilize the amplifier output. The voltage at the operational amplifier output 488 is applied to a gate of the NMOS transistor MN424 which transistor converts the voltage at the output of the operational amplifier 416 to an output current. The NMOS transistor MN424 has its source connected to the ground reference line 458 and its drain connected as an input to the current mirror input branch that includes cascoded PMOS transistors MP420 and MP422 connected as shown to positive voltage supply line 450. The current mirror 490 has a bias branch that includes PMOS transistor MP430 connected to the positive voltage supply line 450. PMOS transistor MP430 receives a current bias from an NMOS bias current transistor MN432.

The gates of the current mirror input branch transistor MP422, the bias branch transistor MP430, the first output branch transistor MP403, the second output branch transistor MP412 and the third output branch transistor MP442 are connected in common by a line 454. In similar manner, the gates of current input branch transistor MP420, the first output branch transistor MP401, the second output branch transistor 410 and the third output branch transistor 440 are connected in common by a line 452. As well known in the art and as described in detail at pages 256 through 259 of Analog Integrated Circuit Design by David A. Johns and Ken Martin, John Wiley & Sons, 1997, with respect to the operation of cascoded current mirrors, the aforementioned coupling of current mirror branch transistor gates, provides control of the output branch currents in response to the current applied to the input branch by the voltage to current converter transistor MN424.

In FIG. 4, the channels of the transistors MP420, MP422 of the current mirror input branch are the substantially the same as the channels of the transistors MP401 and MP403 of the first current mirror output branch and are substantially the same as the channels of the transistors MP410 and MP412 of the second current mirror output branch. As a result, a signal current in the serially connected source-drain paths of transistors MP401 and MP403 of the first current mirror output branch is substantially equal to the signal current applied to the current mirror input branch from the voltage to current converter transistor MN424. Similarly, a signal current in the serially connected source-drain paths of transistors MP410 and 412 of the current mirror second output branch is substantially equal to the signal current applied to the current mirror input branch.

The signal current from transistor MP412 corresponding to the output current from voltage-to-current converter MN424 flows through the resistor 415 so that a feed back voltage appears on the input line 482 of the operational amplifier to control the gain of the amplifier. The voltage on input line 482 is the same as the voltage on the input line 482 in view of the very high voltage gain of the operational amplifier. In accordance with the invention, both the coupling from the magneto-resistive head 103 and the current mirror feedback to the input of the operational amplifier are isolated from the ground reference line 458 to which the resistor 444 and the voltage measuring device 484 are returned.

The PMOS transistors MP440 and MP442 of the third current mirror output branch have channels which provide current flow that is a multiple of the current input to the input branch transistors MP420 and MP422. Accordingly, the current from the serially connected source-drain paths of the transistors MP440 and MP442 of the current mirror third output branch to load resistor 444 is a multiple M of the input current to the current mirror from the drain of the voltage-to-current converter transistor MN424. As an example, where resistive elements 415 and 444 both have 20,000 ohms, the signal voltage from the magneto-resistive head is 200 millivolts and the multiple M is 5, the voltage across the resistor 444 applied to the input of voltage measuring device 484 is 1 volt referenced to the ground potential of line 458.

Figure 5:
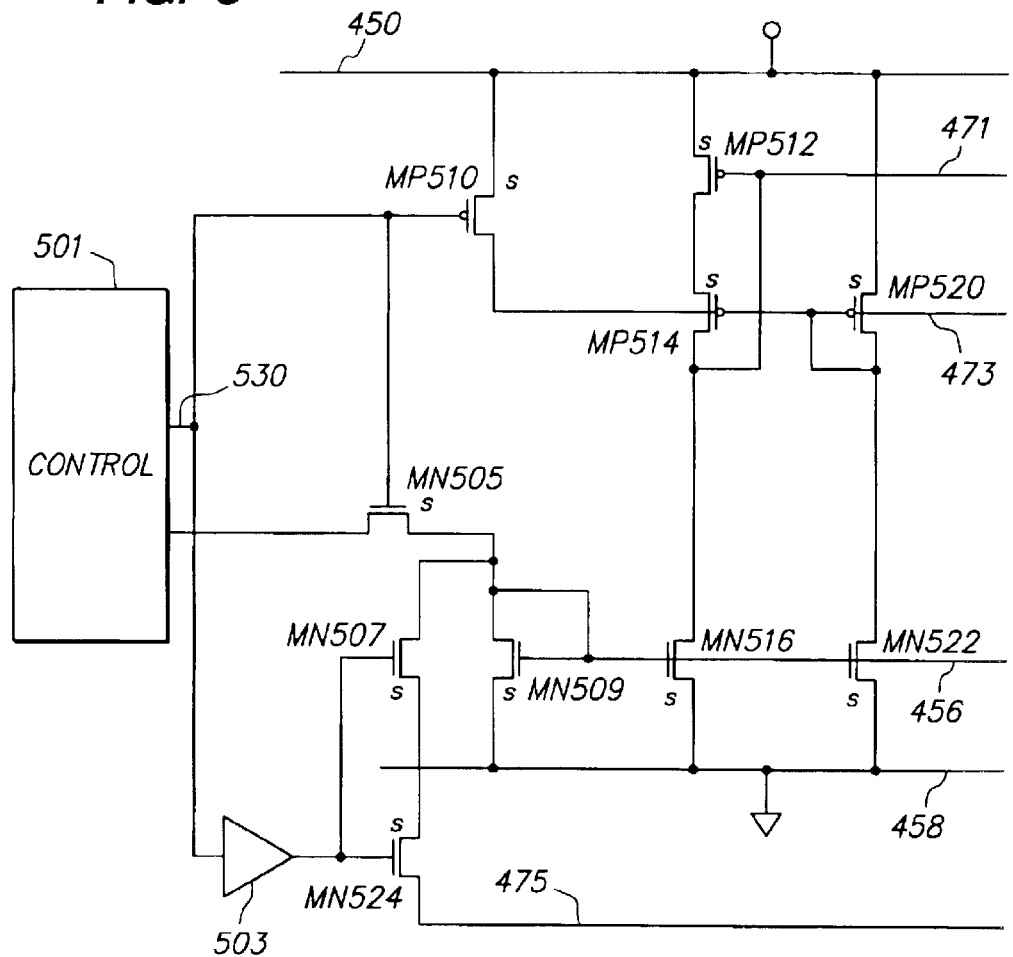
FIG. 5 depicts a CMOS circuit for providing control and bias signals to the circuit of FIG. 4.

FIG. 5 shows a CMOS circuit that provides control signals and bias current to the magneto resistive measurement arrangement of FIG. 4. In FIG. 5, there is shown a control 501 which may be a part of a hard disk controller in a processing system, a current mirror including NMOS transistors MN509, MN516 and MN522, a current mirror including PMOS transistors MP512, MP514 and MP520, an inverter 503 and NMOS switching transistors MN505, MN507 and MN524. A lead 530 from the control 501 provides a signal that determines whether the magneto resistive head 103 is connected for normal operation or is connected to the operational amplifier 416 to measure the voltage therefrom.

When the magneto resistive head 103 is in normal operation, a low l v l signal on lead 530 turns on switching transistor MP510 to connect gates of current mirror transistors MP514 and MP520 to positive supply line 450 whereby the current mirror is disabled. The lines 471 and 473 from the current mirror are connected to bias inputs of the operational amplifier 416 so that the operational amplifier bias current sources are turned off.

The low output on the lead 530 in the normal operation mode turns off switching transistor MN505 to stop flow of bias current from the control 501. A high output level of inverter 503 in the normal operation mode causes NMOS switching transistor MN507 to conduct which connects the gates of current mirror transistors MN509, MN516, MN522 and MN532 in FIG. 4 to the ground reference line 458. As a result, the current mirror 490 in FIG. 4 is disabled. Switching NMOS transistor MN524 is turned on by the high level output of inverter 503 so that the output of the operational amplifier 416 is connected to the ground reference line 458. Switching PMOS transistors MP407 and MP409 are turned off by the high level applied to lead 486. Accordingly, a low level signal from the control 501 disconnects the magneto resistive head 103 from the circuit of FIG. 4 and disables the operation of the circuit of FIG. 4.

In a magneto resistive head measurement mode, the output on lead 530 of control 501 is at a high level. The PMOS switching transistor 510 is turned off and the current mirror including the PMOS transistors MP512, MP514 and MP520 is permitted to operate. The output of inverter 503 is at its low level. The NMOS transistor MN505 is turned on to apply bias current from control 501. The NMOS switching transistor MN507 is turned off so that the current mirror including the NMOS transistors MN509, MN516, MN522 and MN532 is operational to provide bias current. The NMOS switching transistor MN524 is turned off by the low level output of the inverter 503 to remove the operational amplifier output from the ground line connection and the high level at line 530 turns on the switching transistors MP407 and MP409 in FIG. 4 to connect the magneto resistive head 103 to the inputs of the operational amplifier 416. Accordingly, the high output of the control 501 on the lead 530 permits the circuit of FIG. 4 to perform the magneto-resistive head voltage measurement.

The turn-on of switching transistor MN505 and the turn-off of the switching transistor MN507 allows operation of the current mirror including the NMOS transistors MN509, MN516 and MN522. The gates of the NMOS transistors MN509, MN516 and MN522 are connected together. As a result, the drain currents of the NMOS transistors MN516 and MN522 are fixed in response to the drain current of the NMOS transistor MN509. The NMOS transistors MN516 and MN522 supply input and bias currents to the current mirror including the PMOS transistors MP512, MP514 and MP520. The NMOS transistor MN516 provides an input current to the input current branch of PMOS transistors MP512 and MP514 while the NMOS transistor MN522 supplies a bias current to the bias current branch of PMOS transistor MP520. Accordingly, the voltages on lines 471 and 473 are set to provide appropriate biases for the operation of the operational amplifier 416.

Figure 6:
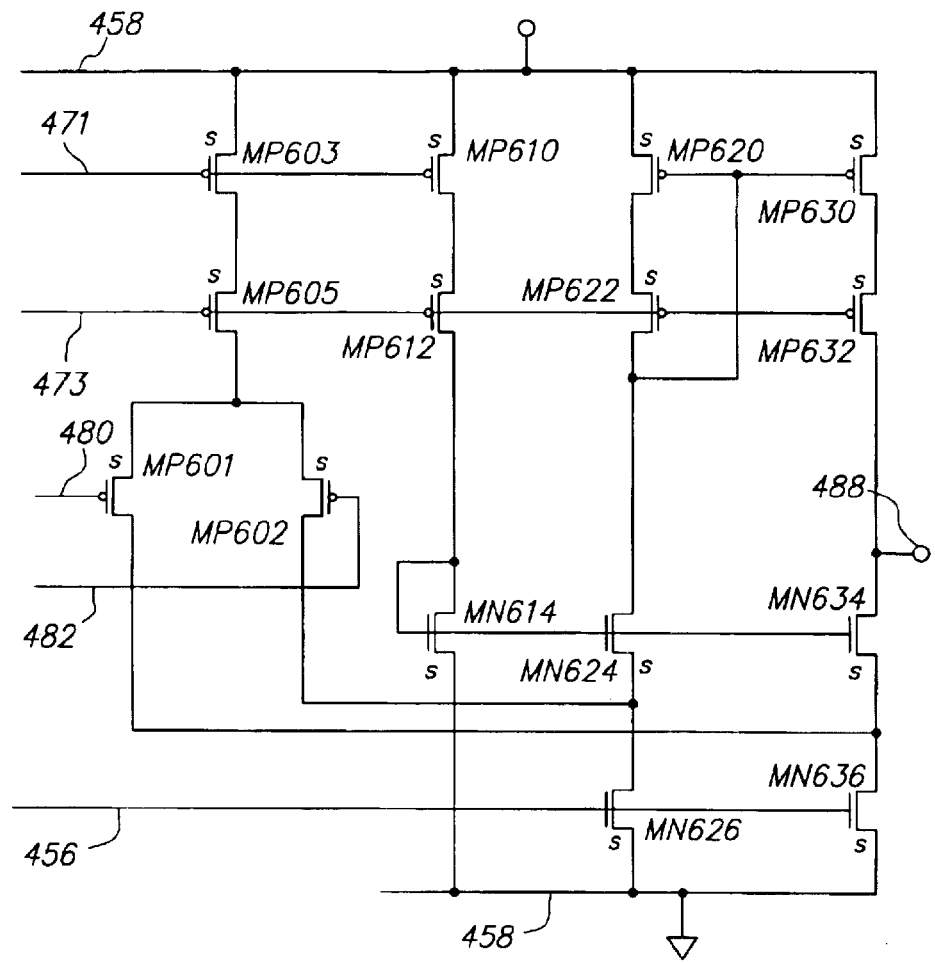
FIG. 6 shows a more detailed schematic diagram of a CMOS operational amplifier circuit that may be used in the circuit of FIG. 4.

FIG. 6 shows a schematic diagram of a CMOS circuit that may be used as the operational amplifier circuit in FIG. 4. In FIG. 6, there are a differential pair of PMOS transistors MP601 and MP602 having inputs connected to the gates thereof and a current source of cascoded PMOS transistors MP603 and MP605 connected to the sources of transistors MP601 and MP602. Serially connected PMOS transistors MP610 and MP612 and NMOS transistor MN614 provide a bias arrangement for the NMOS cascode transistors MN624 and MN634. NMOS transistors MN626 and MN636 are bias current transistors for the NMOS cascode transistors MN624 and MN634. PMOS transistors MP620, MP622, MP630 and MP632 are arranged as a current mirror. The line 450 provides a positive supply voltage to the sources of the PMOS transistors MP603, MP610, MP620 and MP630. The sources of the NMOS transistors MN614, MN626 and MN636 are connected to the ground reference line 458. The positive bias line 471 supplies a bias voltage to the gates of the PMOS transistors MP603 and MP610. This bias voltage determines the bias currents in their source drain paths. The positive bias line 473 supplies an appropriate bias voltage to the PMOS cascode transistors MP605, MP612, MP622 and MP632 and the negative bias line 456 provides a bias voltage for the operation of the NMOS bias current transistors MN626 and MN636.

In normal operation of the magneto resistive head 103, the positive bias lines 471 and 473 are connected to the positive supply line 450. The negative bias line 456 and the output of the operational amplifier 416 are connected to the ground reference line 458. When the circuit of FIG. 4 is operating in the magneto resistive head measurement mode, the gates of PMOS transistors MP601 and MP602 receive the signals from the input coupling 492 at their gates and operate in differential mode with bias current supplied from the current source transistors MP603 and MP605. The output signal at the drain of the PMOS transistor MP601 is applied to the source of the NMOS cascode transistor MN626 and the output signal at the drain of the PMOS transistor MP602 is applied to the source of the MNOS cascode transistor MP636. The drain current from the NMOS transistor MN624 is supplied as an input to the current mirror input branch of the PMOS transistors MP620 and MP622. The current mirror output branch of the PMOS transistors MP630 and MP634 provides an output signal to the output terminal 488. An inverse output signal is obtained at the drain of the cascode transistor MP634 in response to the signal at the source of transistor MP634 from the drain of PMOS transistor MP601.

While the invention has been described in conjunction with a specific embodiment, it is evident to those skilled in the art that many further alternatives, modifications and variations will be apparent in light of the foregoing description. Moreover, it is contemplated that the present invention is not limited to the particular circuit arrangement described and may utilize other appropriate operational amplifier and feedback arrangements. Thus, the invention described herein is intended to embrace all such alternatives, modifications, applications and variations as may fall within the spirit and scope of the appended claims.

What is claimed is:

1. A circuit for measuring a voltage output across a voltage transducer that is substantially isolated from a fixed potential, comprising:

an op amp having differential inputs and a voltage output;

a coupling circuit that is substantially isolated from said fixed potential and that selectively couples said voltage output across said voltage transducer to said differential inputs of said op amp;

a voltage to current converter that receives said voltage output of said op amp and that generates a current output;

a current feedback circuit that feeds back said current output from said voltage to current converter to said differential inputs; and a voltage measuring device that receives said feedback current from said current feedback circuit and that generates a voltage measurement, which is referenced to said fixed potential, of said voltage output across said voltage transducer.

2. The circuit of claim 1 wherein said voltage transducer is a magneto-resistive head.

3. The circuit of claim 1 wherein said current feedback circuit includes a current mirror.

4. The circuit of claim 1 wherein said coupling circuit includes:

a first transistor having a gate, a source and a drain;

a second transistor having a gate, a source and a drain, wherein at least one of said source and said drain of said first transistor communicates with one end of said voltage transducer and the other of said source and said drain communicates with a gate of said second transistor, and wherein at least one of said source and said drain of said second transistor communicates with said current feedback circuit and one of said differential inputs of said op amp.

5. The circuit of claim 4 wherein said coupling circuit includes:

a third transistor having a gate, a source and a drain;

a fourth transistor having a gate, a source and a drain;

a resistance having one end that communicates with said feedback circuit and another of said differential inputs of said op amp, wherein at least one of said source and said drain of said third transistor communicates with another end of said voltage transducer and the other of said source and said drain communicates with a gate of said fourth transistor, and wherein at least one of said source and said drain of said fourth transistor communicates with said current feedback circuit and another end of said resistance.

6. The circuit of claim 5 wherein said current feedback circuit includes a current mirror with:

a bias branch that receives a bias current;

an input branch that communicates with said current to voltage converter;

a first output branch that communicates with second transistor of said coupling circuit;

a second output branch that communicates with said fourth transistor of said coupling circuit; and a third output branch that communicates with said voltage measuring device.

7. A circuit for measuring a voltage output across a voltage transducer that is substantially isolated from a fixed potential, comprising:

differential amplifying means having differential inputs and a voltage output for amplifying a signal input thereto;

coupling means that is substantially isolated from said fixed potential for selectively coupling said voltage output across said voltage transducer to said differential inputs of said differential amplifying means;

converting means for receiving said voltage output of said differential amplifying means and for generating a current output;

current feedback means for feeding back said current output from said converting means to said differential inputs; and measuring means for receiving said feedback current from said current feedback means and for generating a voltage measurement, which is referenced to said fixed potential, of said voltage output across said voltage transducer.

8. The circuit of claim 7 wherein said voltage transducer is a magneto-resistive head.

9. The circuit of claim 7 wherein said current feedback means includes a current mirror.

10. The circuit of claim 7 wherein said coupling means includes:

a first transistor having a gate, a source and a drain;

a second transistor having a gate, a source and a drain, wherein at least one of said source and said drain of said first transistor communicates with one end of said voltage transducer and the other of said source and said drain communicates with a gate of said second transistor, and wherein at least one of said source and said drain of said second transistor communicates with said current feedback means and one of said differential inputs of said differential amplifying means.

11. The circuit of claim 10 wherein said coupling means includes:

a third transistor having a gate, a source and a drain;

a fourth transistor having a gate, a source and a drain;

resistance means for providing a resistance and having one end that communicates with said feedback means and another of said differential inputs of said differential amplifying means, wherein at least one of said source and said drain of said third transistor communicates with another end of said voltage transducer and the other of said source and said drain communicates with a gate of said fourth transistor, and wherein at least one of said source and said drain of said fourth transistor communicates with said current feedback means and another end of said resistance.

12. The circuit of claim 11 wherein said current feedback means includes a current mirror with:

bias means for providing a bias current;

input means for receiving an input signal from said converting means;

first output means for providing a first output current that is based on said input signal and that communicates with second transistor of said coupling means;

second output means for providing a second output current that is based on said input signal and that communicates with said fourth transistor of said coupling means; and third output means for providing a third output current that is based on said input signal and that communicates with said measuring means.

* * * * *

UNITED STATES PATENT AND TRADEMARK OFFICE
CERTIFICATE OF CORRECTION

PATENT NO. : 6,958,872 B1  Page 1 of 1
APPLICATION NO. : 10/683478
DATED : October 25, 2005
INVENTOR(S) : Cheng et al.

It is certified that error appears in the above-identified patent and that said Letters Patent is hereby corrected as shown below:

IN THE PATENT:

| | |
|---|---|
| Column 2, Line 49: | Delete "cascaded" and insert -- cascoded -- |
| Column 5, Line 16: | Delete "M409" and insert -- MN409 -- |
| Column 6, Line 66: | Delete "lvl" and insert -- level -- |
| Column 8, Line 29: | Delete "MNOS" and insert -- NMOS -- |

Signed and Sealed this

Fifth Day of December, 2006

JON W. DUDAS
*Director of the United States Patent and Trademark Office*